United States Patent
Fong et al.

(10) Patent No.: US 11,216,205 B2
(45) Date of Patent: Jan. 4, 2022

(54) INTELLIGENT CHECKPOINT PAGE SERVER FOR CONTAINERS

(71) Applicant: EMC IP Holding Company LLC, Hopkinton, MA (US)

(72) Inventors: Victor Fong, Medford, MA (US); Kenneth Durazzo, San Jose, CA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 41 days.

(21) Appl. No.: 16/804,233

(22) Filed: Feb. 28, 2020

(65) Prior Publication Data

US 2021/0271392 A1    Sep. 2, 2021

(51) Int. Cl.
*G06F 3/06* (2006.01)
*G06F 30/20* (2020.01)

(52) U.S. Cl.
CPC ............ *G06F 3/065* (2013.01); *G06F 3/0619* (2013.01); *G06F 3/0665* (2013.01); *G06F 3/0673* (2013.01); *G06F 30/20* (2020.01)

(58) Field of Classification Search
CPC ...... G06F 3/065; G06F 3/0673; G06F 3/0619; G06F 3/0665; G06F 30/20
See application file for complete search history.

(56) References Cited

U.S. PATENT DOCUMENTS

| | | | |
|---|---|---|---|
| 2018/0285199 A1* | 10/2018 | Mitkar | G06F 11/1451 |
| 2020/0042343 A1* | 2/2020 | Wang | G06F 9/45558 |
| 2020/0226024 A1* | 7/2020 | Lin | G06F 11/1451 |
| 2021/0026671 A1* | 1/2021 | Hadas | G06F 9/45558 |

* cited by examiner

*Primary Examiner* — Hiep T Nguyen
(74) *Attorney, Agent, or Firm* — Workman Nydegger

(57) ABSTRACT

A checkpoint server for containers is disclosed. The checkpoint server generates checkpoint images of running containers or of warmed-up containers. These checkpoint images are restored such that the order in which memory pages are accessed can be recorded or logged. During a restore operation to a host, the memory pages are transmitted in accordance with the page order log. The container can then begin serving requests before all of the memory pages have been transmitted to the host.

20 Claims, 5 Drawing Sheets

INTELLIGENT CHECKPOINT PAGE SERVER FOR CONTAINERS

FIELD OF THE INVENTION

Embodiments of the present invention generally relate to container operations and container related operations. More particularly, at least some embodiments of the invention relate to systems, hardware, software, computer-readable media, and methods for data protection operations for containers including checkpoint, backup, and recover operations.

BACKGROUND

The manner in which computer programs are written and deployed has changed over time. Conventionally, computer software was installed on a computer and the program was executed on that machine. While some programs are still machine specific, many programs now operate in a number of different contexts based on network configuration and other considerations.

For example, applications in the cloud are often implemented using virtual machines and containers. Containers, in particular, have seen increasing use in cloud-based computing environments. One of the benefits of containers is that they are supposed to have fast start-up times on the order of milliseconds. In reality, however, this type of start-up time may not be achieved for many reasons.

In fact, containers are subject to some of the same issues that impact other software deployments. For example, there is still a need to perform various levels of processing before an application is ready to serve clients, particularly when an application is cold-starting. As a result, there is a need in the computer arts for ways to improve performance with respect to the manner in which computer programs are deployed and operated.

BRIEF DESCRIPTION OF THE DRAWINGS

In order to describe the manner in which at least some of the advantages and features of the invention may be obtained, a more particular description of embodiments of the invention will be rendered by reference to specific embodiments thereof which are illustrated in the appended drawings. Understanding that these drawings depict only typical embodiments of the invention and are not therefore to be considered to be limiting of its scope, embodiments of the invention will be described and explained with additional specificity and detail through the use of the accompanying drawings, in which.

DETAILED DESCRIPTION OF SOME EXAMPLE EMBODIMENTS

Figure 1:
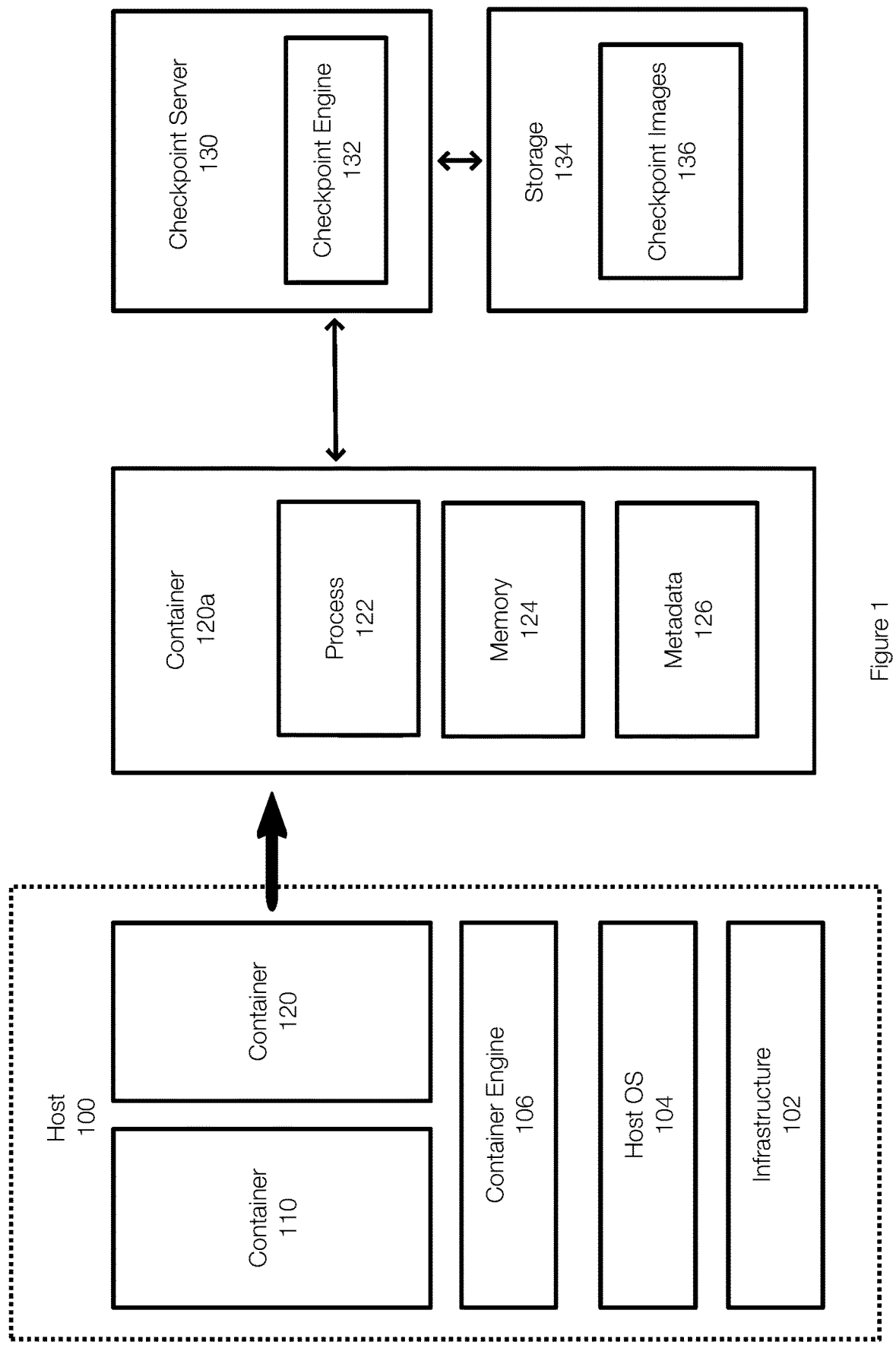
FIG. 1 illustrates an example of a checkpoint system configured to perform container related restore operations.

Embodiments of the present invention generally relate to application start operations and deployment operations. More particularly, at least some embodiments of the invention relate to systems, hardware, software, computer-readable media, and methods for container related operations such as container backup operations, container checkpoint operations, container restore operations, container simulation operations, container deployment operations, or the like or combination thereof.

In general, example embodiments of the invention relate to container checkpoint and restoration mechanisms that allow containers to be restored from checkpoint images (e.g., backups, images or snapshots of running containers or warmed-up containers). In some examples, restoring a container from a checkpoint image instead of cold starting a new container can improve performance by reducing the time needed to get a container up and running.

More specifically, embodiments of the invention restore a container from a checkpoint image by sequencing the manner in which a checkpoint image is restored to a host. Because a checkpoint image of a container may include a dump or copy of the container's memory, the container is restored by selectively transmitting the memory pages in a particular order, which may not be sequential. The order in which the memory pages are transmitted may depend on a simulation of the container such that the order in which memory pages are used or accessed can be determined. This allows a container to be restored more quickly and begin operation even which the entire checkpoint image has not been transmitted. In other words, the container restore operation, using a checkpoint image, does not need to wait for the entire checkpoint image to be downloaded.

Embodiments of the invention can provide performance improvements in some instances compared, for example, to cold starting a container. In other words, restoring a container from a container image may be more efficient that cold-starting another instance of a container. For example, a container that is configured to perform a neural network-based inference function might need to load the neural network model and associated weights from an object storage at start-up time. Other applications might require time to sufficiently warm up (e.g., EJB—enterprise javabeans). These operations require time to complete before the container is warmed-up and ready for service or ready to respond to client requests.

The performance issues associated with these types of cold-start issues can be addressed using container checkpoint images and restore mechanisms. For containers that take a long start-up time, checkpoint images can be made or generated after the container is warmed up, but before the container is generally available (accepting requests). The containers are then simulated and a log is kept that defines how the memory pages are accessed. The checkpoint image and associated log are then stored.

When deploying the checkpoint image, instead of cold-starting a new container, the container can be restored from the checkpoint image. The approach to take (cold-start or restore from a checkpoint image) may depend on whether the restoration time is faster than the cold-start time. Embodiments of the invention relate to the approach of restoring containers from container checkpoint images and to optimizations thereof.

Embodiments of the invention include an intelligent checkpoint page-server (ICPS or checkpoint server) that can be used to reduce the amount of time needed to restore a container by introducing sequenced memory page transmission into the restore operation. Embodiments of the invention can further optimize this process by learning from actual restore operations and/or simulated restore operations. For example, an actual restore operation may require the memory pages in a different order. This information can be added to the information already stored in the existing log for that checkpoint image and used for subsequent restore operations.

A checkpoint image may be implemented, by way of example, by taking a snapshot of a running container (or processes). By taking a checkpoint image of a running container, the image can be restored at any location, assuming that the container orchestration stack of the original host and the destination host remains consistent. Embodiments of the invention, however, are able to adapt to differences in the container orchestration stack. For example, a checkpoint image may be provided with configuration data suitable for a different container orchestration stack. The ability to process checkpoint images should be integrated throughout the entire cloud orchestration stack (this is supported, by way of example only, by Linux, Runc and Containerd).

Generally, when generating a checkpoint image, a container is paused and system calls are made (e.g., by a checkpoint server) to dump network connections (TCP—Transmission Control Protocol), memory, and metadata into the checkpoint image. These data may be dumped into serializable bytes and these data form a checkpoint image. In one example, metadata of the container throughout the entire container orchestration stack would also be stored as part of the checkpoint image, so that each layer would be able to restore the necessary information.

The checkpoint and restoration process includes the following steps: pause the container, dump context (e.g., network connections, metadata, memory) to form the checkpoint image, and write the checkpoint image to disk. At a later time, once the memory page log is generated, the checkpoint image may be transmitted to a destination host based on the memory page log, stored on the destination host, and restored into a running container Embodiments of the invention note that, when looking at the composition of a container image, metadata and state information are typically a small part of the checkpoint image. The majority of the checkpoint image is typically the runtime-memory of the process or processes. For example, if a process is using gigabytes of RAM (Random Access Memory), the checkpoint image would include gigabytes of RAM. When dumping the memory, the memory dumps can be divided or organized into pages, which may depend on the page size of the operating system. In one example, deduplication capability on a page-level is available to reduce the size of the checkpoint image.

In one example, the checkpoint server, which is also a page-server, may implement the restore operation using lazy-loading. This is distinct from conventional transmission techniques at least because the order in which the memory pages are transmitted and loaded are related to anticipated memory page access sequence. The checkpoint or page server is co-located on the destination host to prevent double network transmission in one example.

Embodiments of the invention provide several advantages. For example, a container checkpoint and restore process can be performed using eager-load. However, an eager-load restore operation requires transmission of the entire image, which often impacts performance. A simplistic lazy-load approach also has performance issues because the container may be waiting for data transmissions. Embodiments of the invention overcome these issues, by way of example only, by sequencing the manner in which pages are transmitted. This ensures that, even when restoring using a lazy-load technique, the page is likely to arrive before the running container requires the page.

In another example, embodiment of the invention are able to incorporate incremental checkpoint images into the restore operations. Rather than transmit entire checkpoint images, only the relevant pages of multiple checkpoint images are transmitted. More specifically, if the restore process required different pages from a series of checkpoint images, all of the checkpoint images would be transmitted in their entirety conventionally. Embodiments of the invention are able to transmit pages or portions of different checkpoint images in a order that is beneficial to running the container.

Consider an example where four checkpoint images are stored. The first checkpoint image includes pages 1, 2, 3, and 4, the second incremental checkpoint image includes page 3, the third incremental checkpoint image includes page 2, and the fourth incremental checkpoint image includes page 3. Instead of transmitting all four images, which would result in multiple versions of a particular page being transmitted, embodiments of the invention transmit page 1 and 4 from the first checkpoint image, page 2 from the third checkpoint image, and page 3 from the fourth checkpoint image.

As previously stated, when a restoration is done with lazy-migration and a process requires a memory page that is not yet restored, the process would need to wait for the memory-page to be transmitted over the page-server and recover from the page-server. This delay would cause an impact of the runtime performance of the application. Embodiments of the invention overcome this concern by determining in advance which pages are needed by the container and in what order This allows the pages to be transmitted in an order that aligns with the manner in which the pages are used or accessed. As a result, the performance impact often associated with lazy migration can be reduced or eliminated.

Finally, embodiments of the invention relate to a restore process that may be faster than the cold start up time of a container. Existing CaaS (Containers as a Service), PaaS (Platform as a Service) and FaaS (Function as a Service) solutions do not utilize any checkpoint capability. Containers of functions are cold started when there is no active container running a specific function. As previously stated, the cold-start time is significant for some programming languages (like Java, which requires JVM to be started) or functions (like inference function, which require machine learning models and weights to be loaded), resulting in runtime performance impact. Restoring from a checkpoint image can reduce the runtime performance impact compared to cold starting a container.

Embodiments of the invention perform a restore operation for containers. As previously indicated, this includes identifying the order in which memory-page accesses occur and then restoring the memory pages in that order. The order can be learned by simulation a container, by recording page accesses in a running container, or by monitoring the containers and recording page accesses and the order in which the pages are accessed. Further, container orchestration stacks can choose between cold start and restore strategies based on network speed, execution speed, and/or other factors.

FIG. 1 illustrates an example of a computing system in which containers operate and in which checkpoint images of containers are generated. FIG. 1 illustrates a host 100. The host 100 may be on-premise and/or cloud based host and includes an infrastructure 102 that includes hardware such as processors and memory. A host operating system (OS) 104 may be installed on the infrastructure 102. A container engine 106 may be installed on the OS 104. In this example, containers 110 and 120 are operating on the container engine 106. The host 100 or the containers 110 and 120 may operate in the context of a container orchestration system such as Kubernetes.

In one example, the container engine (e.g., docker, container, etc.) abstracts the OS 104 to the containers 110, 120.

The container 120*a* illustrates a more detailed view of the container 120. The container 120*a* may include or support a process 122. The process 122 may use various data structures, data, or other information that is stored or present in a memory 124. For example, a neural network and object weights may be loaded in the memory 124 and the process 122 is able to generate inferences using the neural network. The memory may store variables, outputs, and other data. The container 120*a* may also include or be associated with metadata 126.

The checkpoint server 130 is an example of a data protection system that is configured to perform container and container related applications such as generating checkpoints, simulating containers, restoring containers, or the like. In one example, the checkpoint server 130 may also be configured as a page-server capable of serving pages during a restore process. The checkpoint server 130 includes a checkpoint engine 132 that is configured to perform or facilitate these types of operations. The checkpoint server 130 may be associated with storage 134 (e.g., on premise and/or cloud-based storage) that is configured to store checkpoint images 136.

When generating a checkpoint image, the checkpoint engine 132 may be configured to pause the container 120*a* and then create an image of the container 120*a*, which is stored as a checkpoint image and which is associated with a timestamp in one example.

Generating the checkpoint image may include, after pausing the container 120*a*, gathering sufficient information that allows the checkpoint image to be restored in or as a running container on another host (or on the same host if necessary). The checkpoint image may include network connections, a copy of the contents of the memory 124, and metadata associated with the container 120*a*.

In one example, the checkpoint engine 132 may divide the contents of the memory 124 into pages. The page size may be based on the host OS 104. Thus, the checkpoint server 130 is configured to generate checkpoint images 136 for one or more containers. In addition, for each container protected by or associated with the checkpoint server 130, multiple checkpoint images can be generated. These can be full checkpoint images, incremental checkpoint images or the like. Over time, older checkpoint images can be deleted to manage storage.

Figure 2:
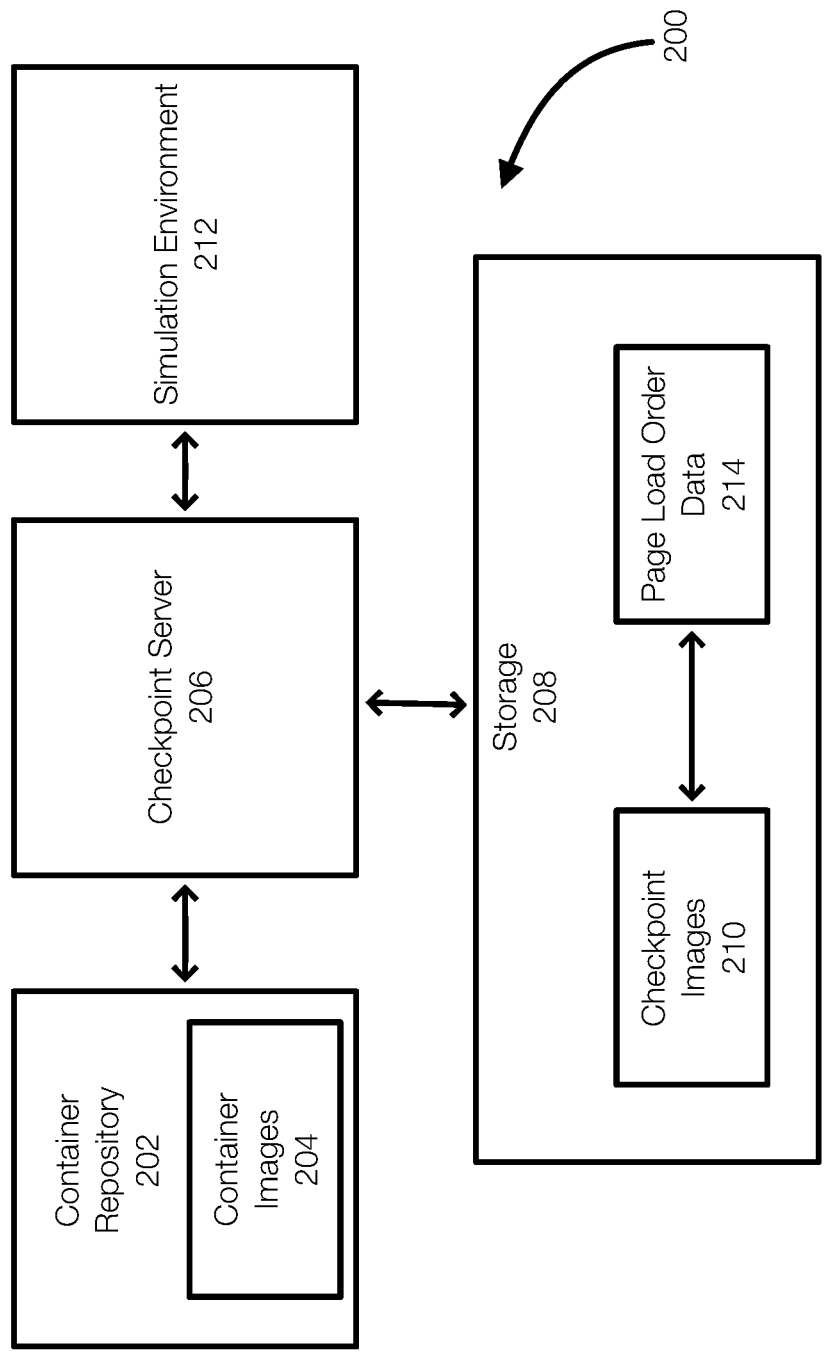
FIG. 2 illustrates a checkpoint server that generates checkpoint images and page access logs for use in restoring the checkpoint image to a host.

FIG. 2 illustrates an example of a checkpoint system 200. The system 200 includes a checkpoint server 206 and a container repository 202. Container images 204 can be uploaded to the container repository 202. The simulation environment 212 allows the checkpoint server 206 to simulate the container images 204 in a closed environment. The environment is closed in the sense that the container images being simulated are not accessible for use outside of the simulation environment 212 or are not available to serve requests.

For example, when a new container image is uploaded to the container repository 202, the checkpoint server 206 may be triggered to obtain and execute the new container image in the simulation environment 212. When the container running in the simulation environment 212 is ready to service requests or is sufficiently warmed-up, a checkpoint image of the running container can be made and stored in the checkpoint images 210. The mechanism for determining when the container is ready can be based on implementation. For example, a library may be provided with code that notifies the checkpoint server 206. A check-alive uniform resource locator, a system call made by the container orchestration stack may be used as well to determine when the simulated container is ready.

After the checkpoint image of the simulated container is formed, the paused container can be terminated and the checkpoint server 206 may proceed to attempt to restore the checkpoint image that was just generated. During the simulated restoration, the checkpoint server 206 identifies and records the order of memory page accesses performed during the restoration. The page load order log is stored in the page load order data 214 and associated with the checkpoint images 210. In one example, each checkpoint image is associated with corresponding a page load log. The memory pages can also be stored as blocks in persistent storage for, by way of example only, disaster recovery purposes.

Figure 3:
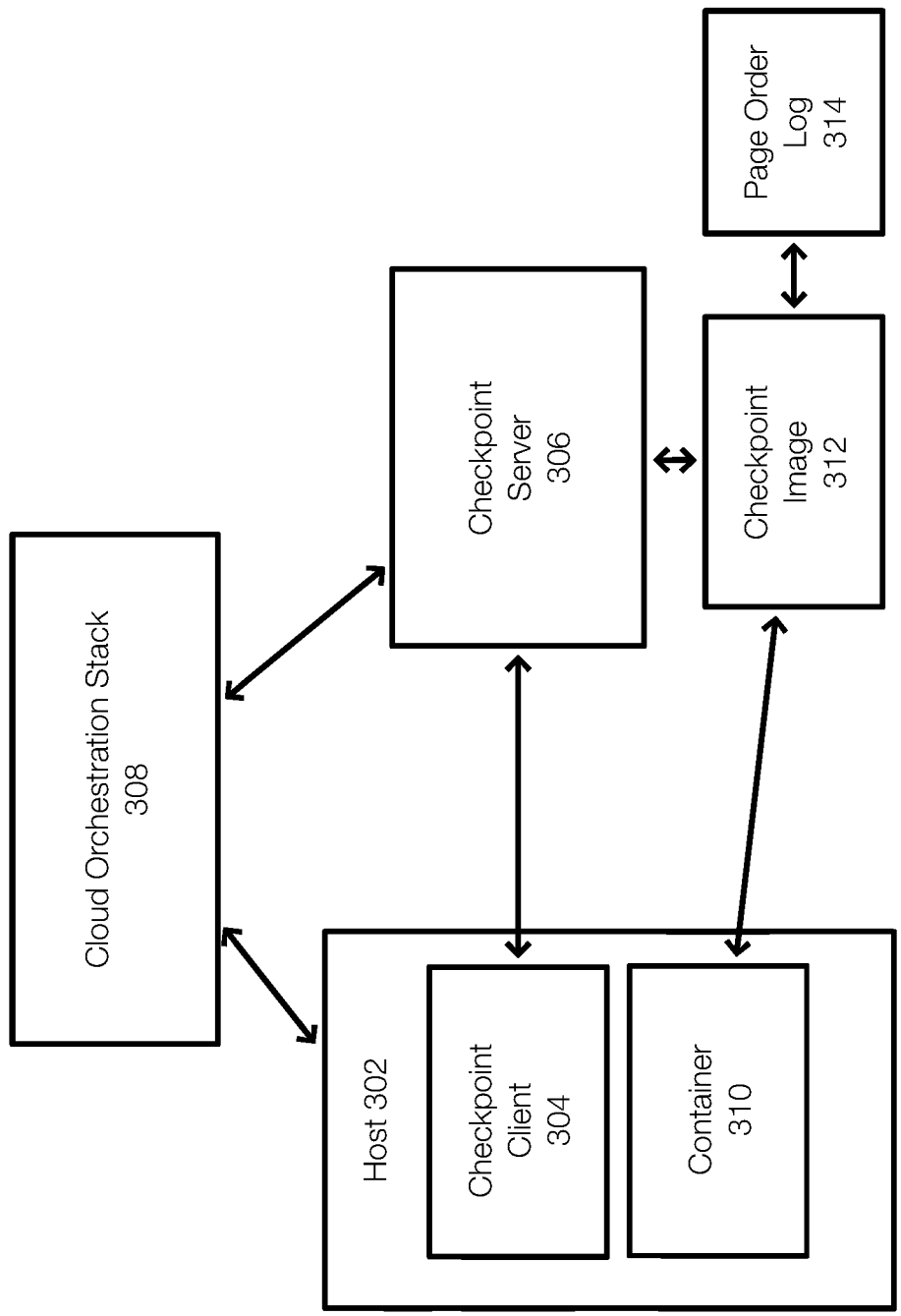
FIG. 3 illustrates an example of a checkpoint server restoring a checkpoint image to a host using a page order log.

FIG. 3 illustrates an example of restoring a container from a checkpoint image in a runtime environment. In this example, a cloud orchestration stack 308, rather that coldstart a container, makes a call to the checkpoint server 306 to restore a checkpoint image into a container 310 on the host 302.

The checkpoint server 306 may then communicate with a checkpoint client 304 that is installed on the host 302. The checkpoint server 302, in response to the call from the cloud orchestration stack 308, begins to transmit a checkpoint image 312 to the checkpoint client 304. The checkpoint image, in one embodiment, is transmitted with the following priority: metadata, lazy load memory pages requested by the client 304 (which may or may not have a copy of the page order log for the checkpoint image 312), memory pages needed during restoration based on the page order log 314 associated with the checkpoint image 312, and all other memory-pages based on the access order.

After the metadata is transferred, the client 304 signals to the orchestration stack 308 that the container is ready to be restored. The memory-page access sequence, stored in the log 314 as previously described, is used to transmit memory pages to the host in the order specified in the log 314. In this example, the transmission of the memory-pages is a stream-like process.

In one example, the container 310 on the host 302 may request a memory page that may not accord with the log 314. This request is given a higher priority than the page order log 314. This information is used to update the page order log 314 for the checkpoint image being restored. Thus, embodiments of the invention are able to not only determine a page-load order from simulation, but also update and learn from real instances of the container during restoration. When multiple checkpoint images are available, the log 314 can be used. However, the pages sent to the container 310 may come from different checkpoint images.

Once the restoration completes, the container 310 is ready to serve. IN this example, restoration may be deemed complete when the container 310 is ready to serve even if there are pages that are still transmitting or that have not yet been transmitted.

Figure 4:
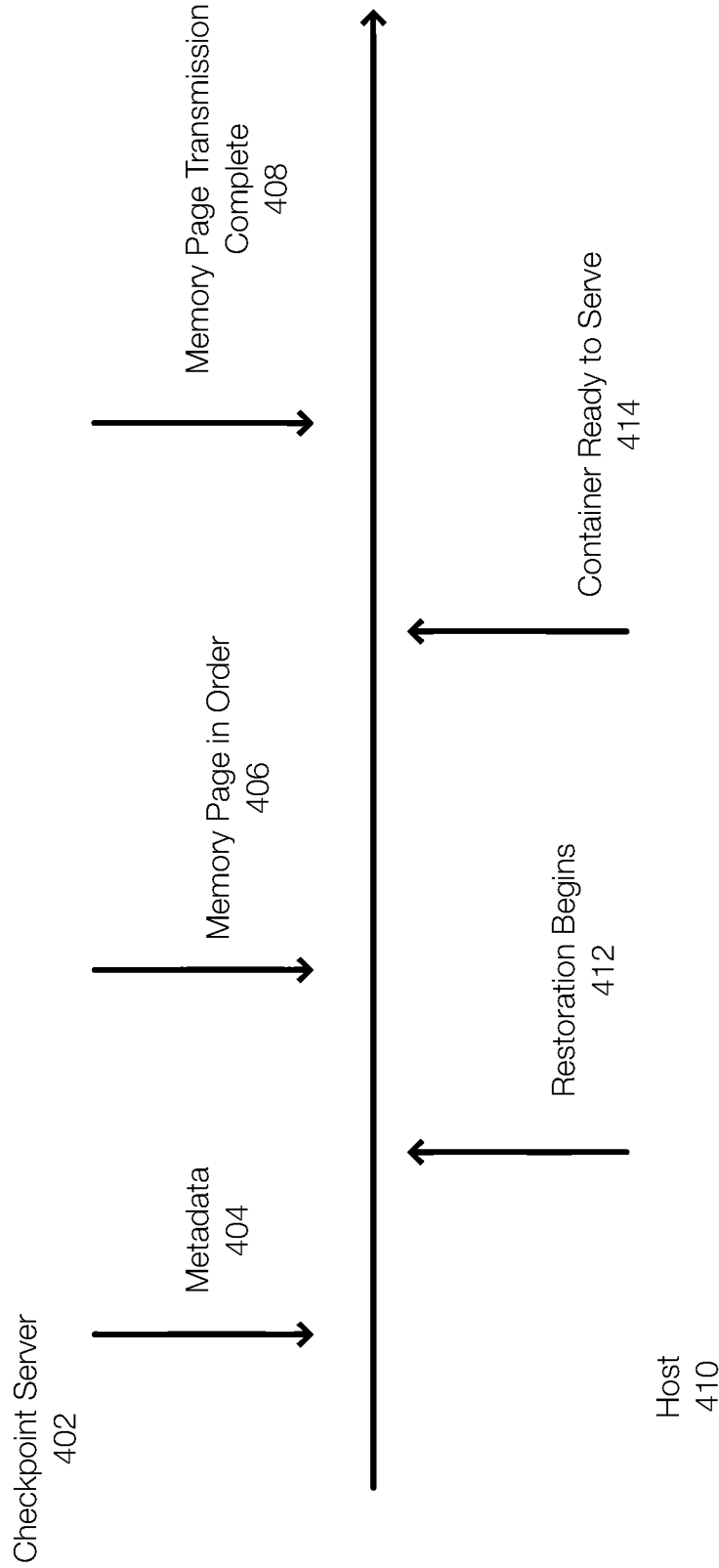
FIG. 4 illustrates a timeline associated with restoring a checkpoint image to a container.

FIG. 4 illustrates a timeline of a restore operation from a checkpoint image. The checkpoint server 402, in response to a call for example for a checkpoint image, begins transmitting metadata 404. The host 410 then begins restoration 412 of the checkpoint image into a container or as a container. The restoration can begin as soon as the metadata is processed for the container.

Next, the memory pages are transmitted in log order 406. At some point, the container is ready to server 414 requests and may begin serving requests. At some point later, the transmission of the memory pages completes 408. The restoration can be deemed completed, by way of example, when the container is ready to server or when all memory pages are transmitted and loaded into the container's memory.

As previously stated, new lazy loading requests may be made by the container being restored. The checkpoint server 402 can capture these requests and update the page order log accordingly. This optimized the checkpoint image and associated page order log for subsequent restore operations.

In one example, multiple restoration points are possible for a container image. For example, multiple restoration points are possible when dealing with clones of containers or for stateful workloads, which can be protected. In this example, the checkpoint server 402 can maintain the order of sequence for transmitting memory pages and flatten out layers of checkpoint images such that only the top layer of each memory page is transmitted to the destination host.

At runtime, the cloud orchestration stack may need to have the container root filesystem already mounted prior to the restored container being ready. The process of obtaining and mounting the container root filesystem can be executed in parallel with the restore processes discussed herein.

Figure 5:
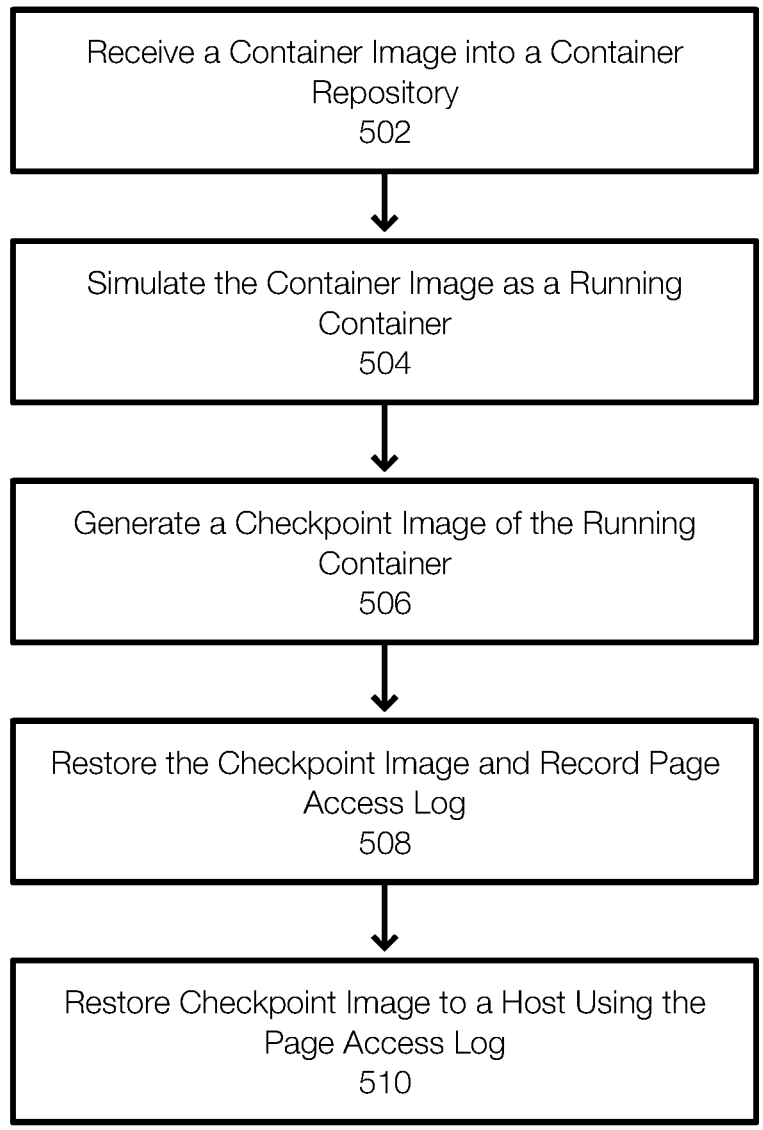
FIG. 5 illustrates an example of a method for restoring a checkpoint image.

FIG. 5 illustrates an example of a method for restoring a container. The method shown in FIG. 5 may be performed using fewer steps as discussed herein. In FIG. 5, a container image is received 502 into a container repository. The container image may be a new container image or an updated container image. Next, the container image is simulated 504 as a running container in a simulation environment. In one example, a simulation may be performed on an existing container image. The container is simulated, in one example, up to the point where the container is warmed-up or ready to serve. Thus, when the resulting checkpoint is restored, the container is ready to serve when restoration completes.

After the container is warmed up in the simulation environment, a checkpoint image is generated 506. This typically includes a copy of network connections, the memory, and other metadata necessary to restore the container. Next, the container is restored using the checkpoint image and the page accesses are recorded 508 or stored in a page access log. When necessary, the checkpoint image is then restored 510 to a host using the page access log to transmit memory pages in the checkpoint image. While restoring the checkpoint image to the host, requests by the host or the restored container for certain memory pages is noted and this information is incorporated into the page access log. This allows the process to be optimized over time.

In one example, checkpoint images can be generated for real running containers. These checkpoint images may be used for backup or disaster recovery purposes.

Embodiments of the invention can be implemented as part of a container orchestration stack, specifically a container checkpoint image repository, so that containers can have a faster start up time. In one example, checkpoint images can be distributed to a host prior to a restoration need. The restoration time still has a performance gain because the container can run as soon as the metadata is loaded and the pages are still loaded in the order specified in the log. This is useful for FaaS at least because functions should have extremely fast start-up times.

Embodiments of the invention can further be implemented as part of a workload protection and disaster recovery system as part of a data protection system. More specifically, containers are becoming increasingly stateful. In other words, containers are being used as stateful applications for various workloads. While workload protection for stateless workloads may not be needed, the state of stateful workloads can be protected.

Embodiments of the invention allow checkpoint images to be made for each running container. When a disaster occurs, recovery to the latest checkpoint can be performed faster without impacting performance, compared to other approaches such that the downtime associated with disaster recovery can be reduced. In other words, the checkpoint images can be used as backups for stateful containers. The checkpoint images can be taken multiple times for backup purposes, particularly when the state changes.

Embodiments of the invention, such as the examples disclosed herein, may be beneficial in a variety of respects. For example, and as will be apparent from the present disclosure, one or more embodiments of the invention may provide one or more advantageous and unexpected effects, in any combination, some examples of which are set forth below. It should be noted that such effects are neither intended, nor should be construed, to limit the scope of the claimed invention in any way. It should further be noted that nothing herein should be construed as constituting an essential or indispensable element of any invention or embodiment. Rather, various aspects of the disclosed embodiments may be combined in a variety of ways so as to define yet further embodiments. Such further embodiments are considered as being within the scope of this disclosure. As well, none of the embodiments embraced within the scope of this disclosure should be construed as resolving, or being limited to the resolution of, any particular problem(s). Nor should any such embodiments be construed to implement, or be limited to implementation of, any particular technical effect(s) or solution(s). Finally, it is not required that any embodiment implement any of the advantageous and unexpected effects disclosed herein.

The following is a discussion of aspects of example operating environments for various embodiments of the invention. This discussion is not intended to limit the scope of the invention, or the applicability of the embodiments, in any way.

In general, embodiments of the invention may be implemented in connection with systems, software, and components, that individually and/or collectively implement, and/or cause the implementation of, container or data protection operations. Such operations may include, but are not limited to, container operations, checkpoint image generation operations, page access log operations, container restore operations, data read/write/delete operations, data deduplication operations, data backup operations, data restore operations, data cloning operations, data archiving operations, and disaster recovery operations. More generally, the scope of the invention embraces any operating environment in which the disclosed concepts may be useful.

New and/or modified data collected and/or generated in connection with some embodiments, may be stored in a data protection environment that may take the form of a public or private cloud storage environment, an on-premises storage environment, and hybrid storage environments that include public and private elements. Any of these example storage environments, may be partly, or completely, virtualized. The storage environment may comprise, or consist of, a datacenter which is operable to service read, write, delete, backup, restore, and/or cloning, operations initiated by one or more clients or other elements of the operating environment. Where a backup comprises groups of data with different respective characteristics, that data may be allocated, and stored, to different respective targets in the storage environment, where the targets each correspond to a data group having one or more particular characteristics.

Example public cloud storage environments in connection with which embodiments of the invention may be employed include, but are not limited to, Microsoft Azure, Amazon AWS, and Google Cloud. More generally however, the scope of the invention is not limited to employment of any particular type or implementation of cloud storage.

In addition to the storage environment, the operating environment may also include one or more clients that are capable of collecting, modifying, and creating, data. As such, a particular client may employ, or otherwise be associated with, one or more instances of each of one or more applications that perform such operations with respect to data.

Devices in the operating environment may take the form of software, physical machines, or virtual machines (VM), or any combination of these, though no particular device implementation or configuration is required for any embodiment. Similarly, data protection system components such as databases, storage servers, storage volumes (LUNs), storage disks, replication services, backup servers, restore servers, backup clients, and restore clients, for example, may likewise take the form of software, physical machines or virtual machines (VM), though no particular component implementation is required for any embodiment. Where VMs are employed, a hypervisor or other virtual machine monitor (VMM) may be employed to create and control the VMs. The term VM embraces, but is not limited to, any virtualization, emulation, or other representation, of one or more computing system elements, such as computing system hardware. A VM may be based on one or more computer architectures, and provides the functionality of a physical computer. A VM implementation may comprise, or at least involve the use of, hardware and/or software. An image of a VM may take various forms, such as a .VMDK file for example.

As used herein, the term 'data' is intended to be broad in scope. Thus, that term embraces, by way of example and not limitation, data segments such as may be produced by data stream segmentation processes, data chunks, data blocks, atomic data, emails, objects of any type, files of any type including media files, word processing files, spreadsheet files, and database files, as well as contacts, directories, sub-directories, volumes, and any group of one or more of the foregoing.

Example embodiments of the invention are applicable to any system capable of storing and handling various types of objects, in analog, digital, or other form. Although terms such as document, file, segment, block, or object may be used by way of example, the principles of the disclosure are not limited to any particular form of representing and storing data or other information. Rather, such principles are equally applicable to any object capable of representing information.

As used herein, the term 'backup' is intended to be broad in scope. As such, example backups in connection with which embodiments of the invention may be employed include, but are not limited to, full backups, partial backups, clones, snapshots, and incremental or differential backups.

Following are some further example embodiments of the invention. These are presented only by way of example and are not intended to limit the scope of the invention in any way.

Embodiment 1. A method, comprising: generating a checkpoint image of a container running in a simulation environment, storing the checkpoint image in a storage, restoring the checkpoint image into the simulation environment, recording memory-page accesses in order in an order page log while restoring the checkpoint image, restoring the checkpoint image to a host, wherein memory pages associated with the checkpoint image are transmitted in an order specified in the order page log.

Embodiment 2. The method of embodiment 1, further comprising receiving a container image from a source and storing the container image in a container repository.

Embodiment 3. The method of embodiment 1 and/or 2, wherein the container running in the simulation environment corresponds to the container image stored in the container repository.

Embodiment 4. The method of embodiment 1, 2, and/or 3, further comprising generating the checkpoint image when the running container is warmed-up and ready to serve requests.

Embodiment 5. The method of embodiment 1, 2, 3 and/or 4, further comprising generating the checkpoint image by dumping contents of a memory of the container as memory pages, metadata associated with the container, and network connections into the checkpoint image.

Embodiment 6. The method of embodiment 1, 2, 3, 4, and/or 5, further comprising starting the restored container on the host when the metadata is loaded, wherein the memory pages are lazy loaded based on the order page log.

Embodiment 7. The method of embodiment 1, 2, 3, 4, 5, and/or 6, further comprising starting the restored container on the host before all of the memory pages in the checkpoint image have been received at the host.

Embodiment 8. The method of embodiment 1, 2, 3, 4, 5, 6, and/or 7, further comprising receiving a request from the host from a memory-page that is out of order with respect to the order page log.

Embodiment 9. The method of embodiment 1, 2, 3, 4, 5, 6, 7, and/or 8, further comprising updating the order page log based on the request from the host.

Embodiment 10. The method of embodiment 1, 2, 3, 4, 5, 6, 7, 8, and/or 9, further comprising storing checkpoint images for disaster recovery.

Embodiment 11. The method as recited in any of embodiments 1 to 10 or portions thereof, further comprising one or more of restoring a container from multiple checkpoints and transmitted only top layer memory pages from the multiple checkpoints such that redundant transmissions are avoided.

Embodiment 12. A method for performing any of the operations, methods, or processes, or any portion of any of these, disclosed herein.

Embodiment 13. A non-transitory storage medium having stored therein instructions that are executable by one or more hardware processors to perform the operations of any one or more of embodiments 1 through 12.

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein, or any part(s) of any method disclosed.

As indicated above, embodiments within the scope of the present invention also include computer storage media, which are physical media for carrying or having computer-executable instructions or data structures stored thereon. Such computer storage media may be any available physical media that may be accessed by a general purpose or special purpose computer.

By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' may refer to software objects or routines that execute on the computing system. The different components, modules, engines, and services described herein may be implemented as objects or processes that execute on the computing system, for example, as separate threads. While the system and methods described herein may be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein.

In terms of computing environments, embodiments of the invention may be performed in client-server environments, whether network or local environments, or in any other suitable environment. Suitable operating environments for at least some embodiments of the invention include cloud computing environments where one or more of a client, server, or other machine may reside and operate in a cloud environment.

Any one or more of the entities disclosed, or implied, by the Figures and/or elsewhere herein, may take the form of, or include, or be implemented on, or hosted by, a physical computing device or computing hardware.

The physical computing device may include a memory which may include one, some, or all, of random access memory (RAM), non-volatile random access memory (NVRAM), read-only memory (ROM), and persistent memory, one or more hardware processors, non-transitory storage media, UI device, and data storage. One or more of the memory components of the physical computing device may take the form of solid state device (SSD) storage. As well, one or more applications may be provided that comprise instructions executable by one or more hardware processors to perform any of the operations, or portions thereof, disclosed herein.

Such executable instructions may take various forms including, for example, instructions executable to perform any method or portion thereof disclosed herein, and/or executable by/at any of a storage site, whether on-premises at an enterprise, or a cloud storage site, client, datacenter, or backup server, to perform any of the functions disclosed herein. As well, such instructions may be executable to perform any of the other operations and methods, and any portions thereof, disclosed herein.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method, comprising:
generating a checkpoint image of a container running in a simulation environment;
storing the checkpoint image in a storage;
restoring the checkpoint image into the simulation environment;
operating the restored checkpoint image as a container in the simulation environment;
recording memory-page accesses performed by the container running in the simulation environment in an order page log, wherein the order page log is associated with the checkpoint image;
restoring the checkpoint image from the storage to a host, wherein memory pages associated with the checkpoint image are transmitted in an order specified in the order page log.

2. The method of claim 1, further comprising receiving a container image from a source and storing the container image in a container repository.

3. The method of claim 2, wherein the container running in the simulation environment corresponds to the container image stored in the container repository.

4. The method of claim 1, further comprising generating the checkpoint image when the running container is warmed-up and ready to serve requests.

5. The method of claim 1, further comprising generating the checkpoint image by dumping contents of a memory of the container as memory pages, metadata associated with the container, and network connections into the checkpoint image.

6. The method of claim 5, further comprising starting the restored container on the host when the metadata is loaded, wherein the memory pages are lazy loaded based on the order page log.

7. The method of claim 6, further comprising starting the restored container on the host before all of the memory pages in the checkpoint image have been received at the host.

8. The method of claim 1, further comprising receiving a request from the host for a memory-page that is out of order with respect to the order page log.

9. The method of claim 8, further comprising updating the order page log based on the request from the host.

10. The method of claim 1, further comprising storing checkpoint images for disaster recovery.

11. A non-transitory storage medium having stored therein instructions that are executable by one or more hardware processors to perform operations comprising:
   generating a checkpoint image of a container running in a simulation environment;
   storing the checkpoint image in a storage;
   restoring the checkpoint image into the simulation environment;
   operating the restored checkpoint image as a container in the simulation environment;
   recording memory-page accesses performed by the container running in the simulation environment in an order page log, wherein the order page log is associated with the checkpoint image;
   restoring the checkpoint image from the storage to a host, wherein memory pages associated with the checkpoint image are transmitted in an order specified in the order page log.

12. The non-transitory storage medium of claim 11, the operations further comprising receiving a container image from a source and storing the container image in a container repository.

13. The non-transitory storage medium of claim 12, wherein the container running in the simulation environment corresponds to the container image stored in the container repository.

14. The non-transitory storage medium of claim 11, the operations further comprising generating the checkpoint image when the running container is warmed-up and ready to serve requests.

15. The non-transitory storage medium of claim 11, the operations further comprising generating the checkpoint image by dumping contents of a memory of the container as memory pages, metadata associated with the container, and network connections into the checkpoint image.

16. The non-transitory storage medium of claim 15, the operations further comprising starting the restored container on the host when the metadata is loaded, wherein the memory pages are lazy loaded based on the order page log.

17. The non-transitory storage medium of claim 16, the operations further comprising starting the restored container on the host before all of the memory pages in the checkpoint image have been received at the host.

18. The non-transitory storage medium of claim 11, the operations further comprising receiving a request from the host for a memory-page that is out of order with respect to the order page log.

19. The non-transitory storage medium of claim 18, the operations further comprising updating the order page log based on the request from the host.

20. The non-transitory storage medium of claim 11, the operations further comprising storing checkpoint images for disaster recovery.

* * * * *